United States Patent [19]

Olsson

[11] Patent Number: 4,769,908
[45] Date of Patent: Sep. 13, 1988

[54] METHOD OF MANUFACTURING A PLURALITY OF CONTACT TERMINALS

[75] Inventor: Billy E. Olsson, New Cumberland, Pa.

[73] Assignee: AMP Incorporated, Harrisburg, Pa.

[21] Appl. No.: 58,101

[22] Filed: Jun. 4, 1987

Related U.S. Application Data

[60] Continuation-in-part of Ser. No. 780,858, Nov. 4, 1985, abandoned, which is a division of Ser. No. 523,201, Aug. 15, 1983, abandoned.

[51] Int. Cl.$^4$ .............................................. H01R 43/16
[52] U.S. Cl. ........................................ 29/884; 29/827; 29/883
[58] Field of Search ................................. 29/882–883, 29/884, 827

[56] References Cited

U.S. PATENT DOCUMENTS

| 3,239,798 | 3/1966 | Silver . | |
|---|---|---|---|
| 3,618,207 | 11/1971 | Sand et al. . | |
| 4,028,794 | 6/1977 | Ritchie et al. . | |
| 4,197,636 | 4/1980 | Osanai | 29/882 |
| 4,245,876 | 1/1981 | Ritchie et al. . | |
| 4,388,757 | 6/1983 | Takeyama et al. | 29/882 |
| 4,395,084 | 7/1983 | Conrad . | |
| 4,461,524 | 7/1984 | McGhee . | |
| 4,547,964 | 10/1985 | Amano et al. | 29/883 |

FOREIGN PATENT DOCUMENTS 947501  1/1964  United Kingdom ................ 104/61

Primary Examiner—Timothy V. Eley
Assistant Examiner—Carl J. Arbes
Attorney, Agent, or Firm—Bruce J. Wolstoncroft

[57] ABSTRACT

A method of producing a plurality of electrical terminals (28) which are in the form of a continuous strip is disclosed. At least one web of insulation material (20) is molded over the terminals (28), so that the insulation material (20) completely surrounds and tightly engages each terminal (28). This method insures that the terminals (28) will be accurately and precisely maintained in position by the insulation material (10). Consequently, the web of insulation material (10) can act as a carrier strip as other operations are performed on terminals (28).

16 Claims, 7 Drawing Sheets

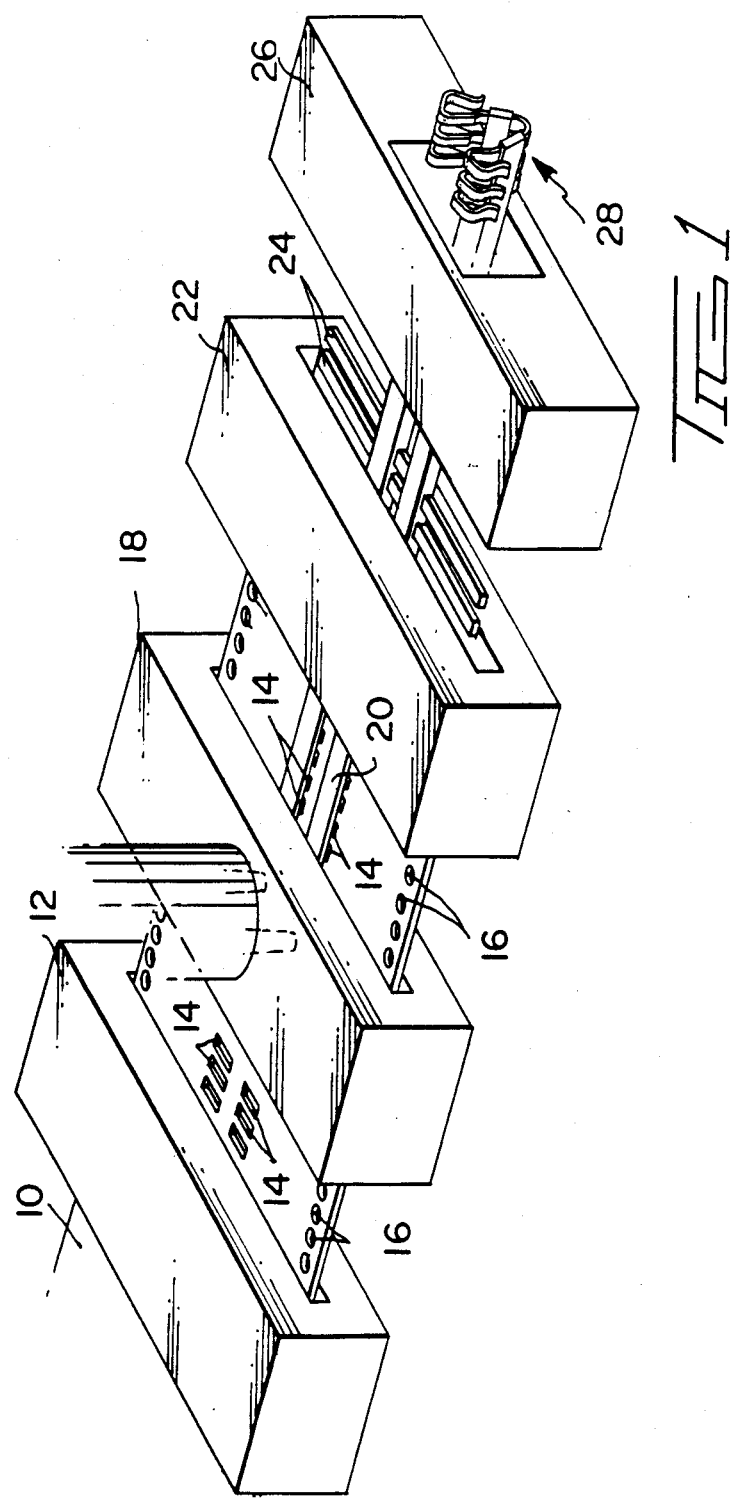

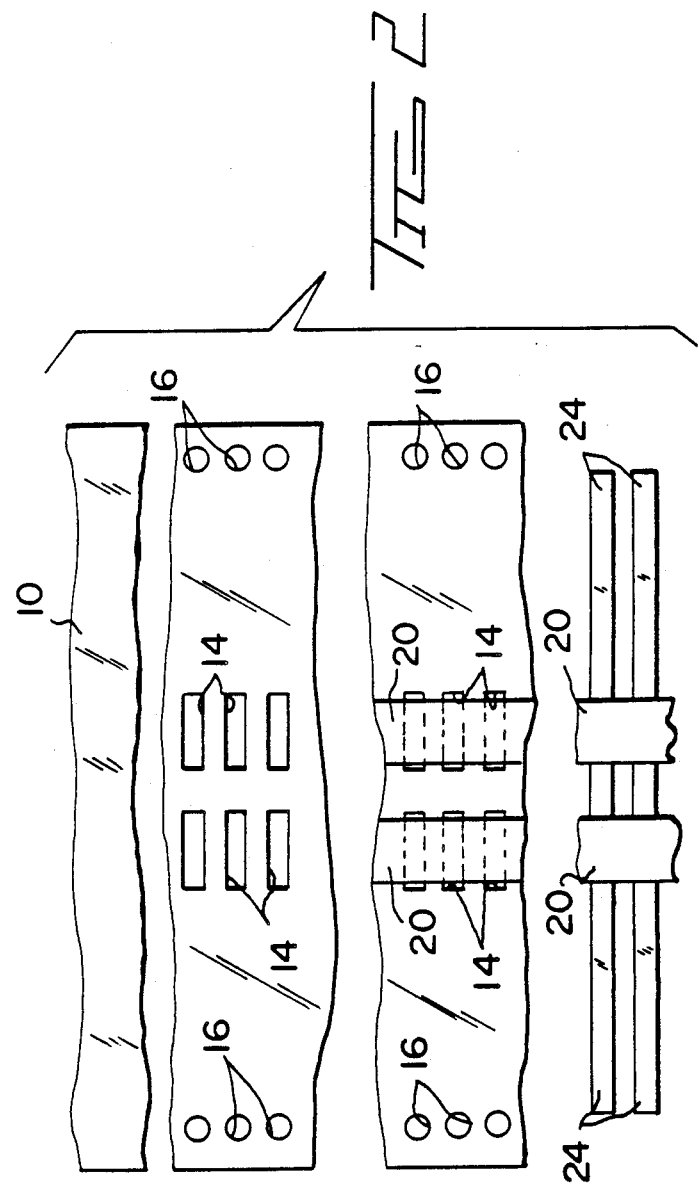

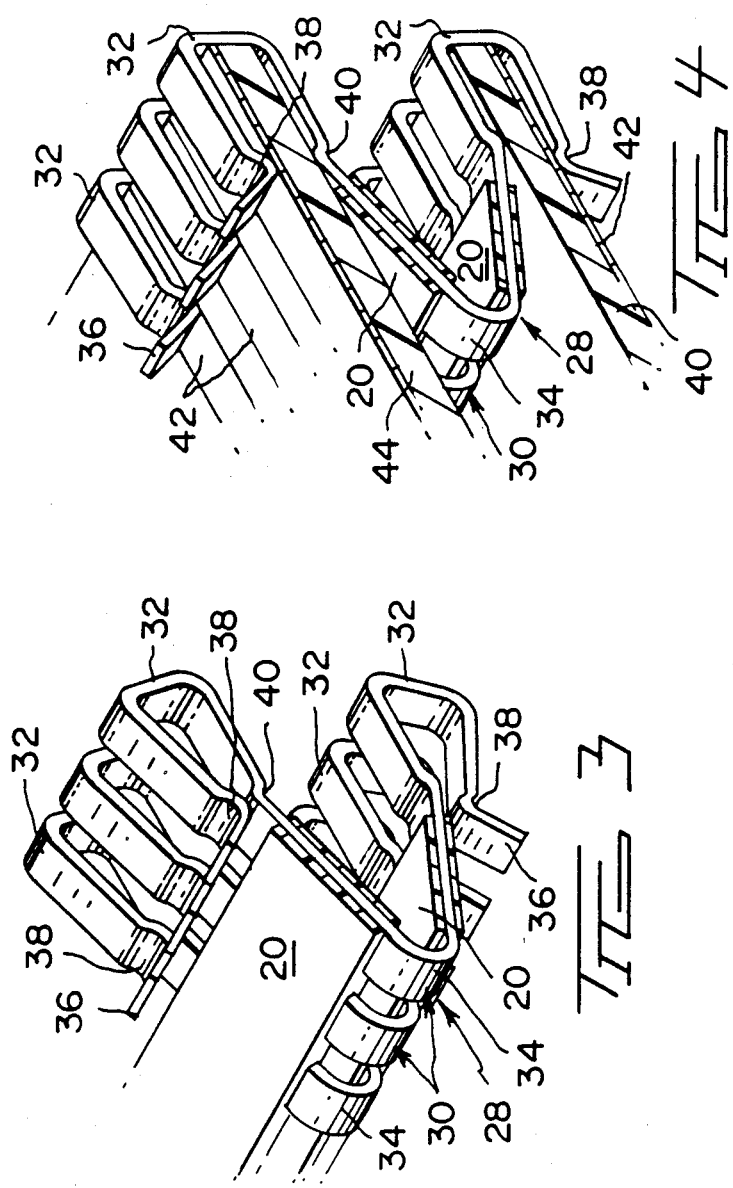

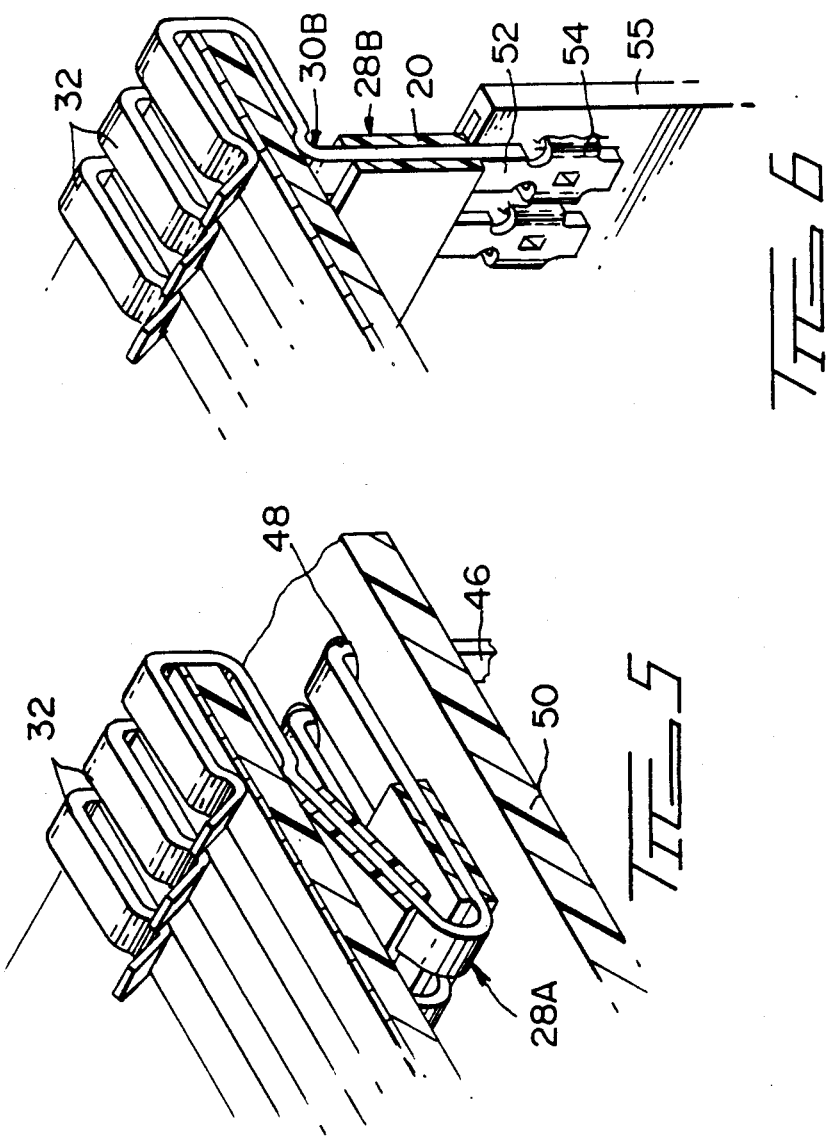

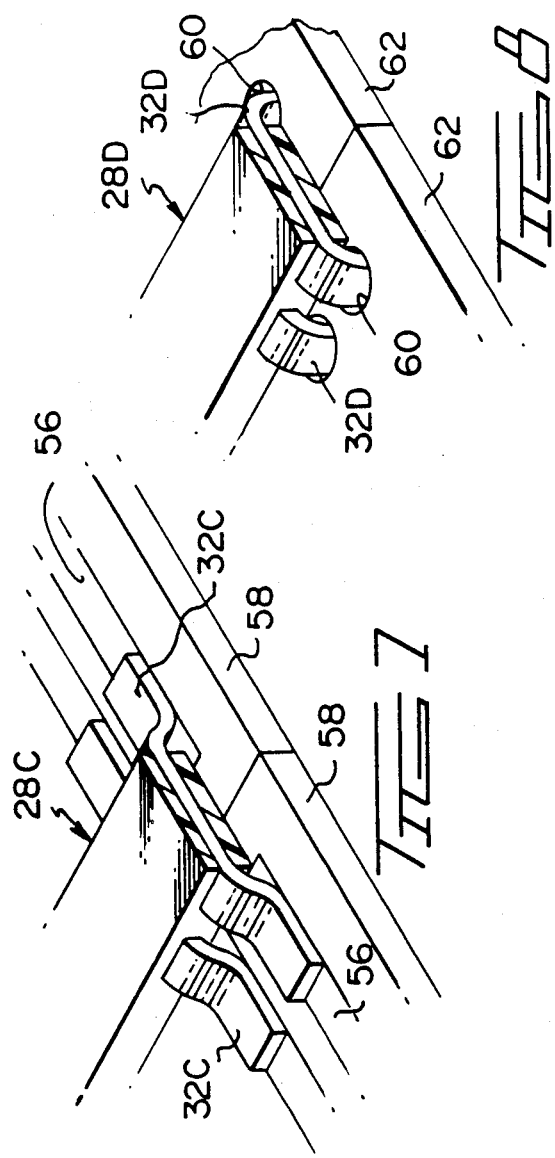

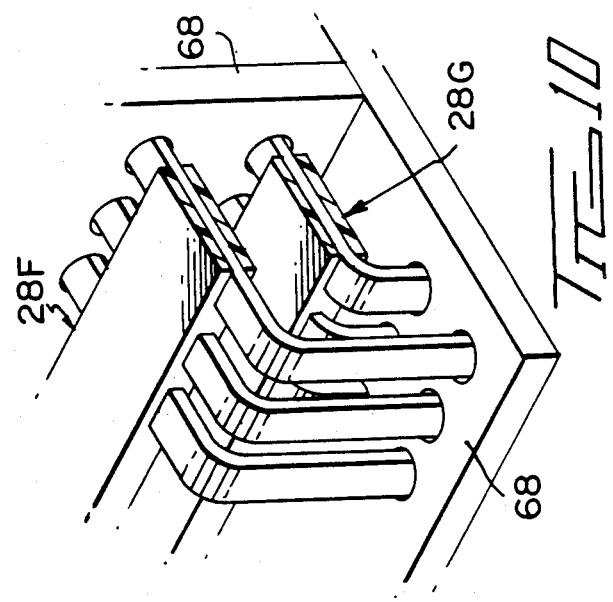
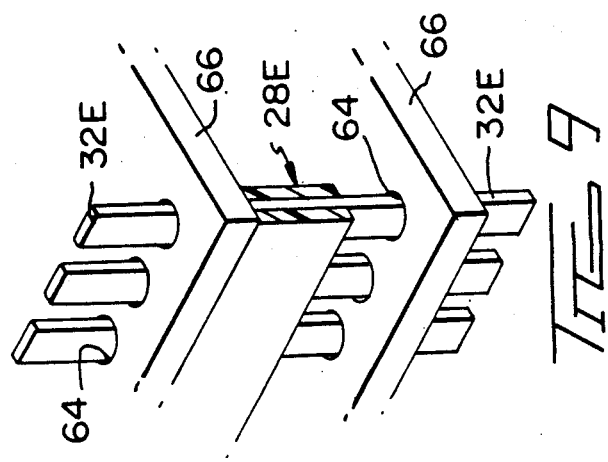

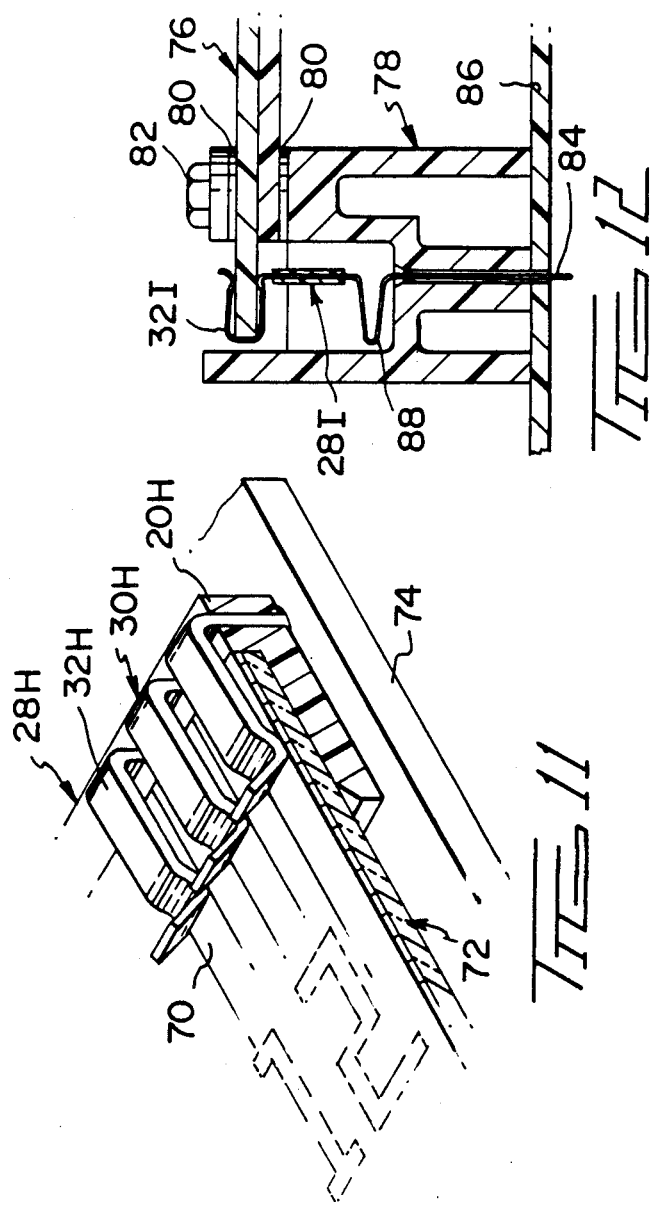

METHOD OF MANUFACTURING A PLURALITY OF CONTACT TERMINALS

RELATED APPLICATIONS

This application is a continuation-in-part of application Ser. No. 780,858, filed Nov. 4, 1985, now abandoned which is a divisional of application Ser. No. 523,201, filed Aug. 15, 1983, now abandoned.

FIELD OF THE INVENTION

The invention relates to a method of producing electrical terminals, and more particularly to a strip of electrical terminals which has at least one web of thin, uninterrupted insulation material molded thereto. The insulation material precisely maintains the terminals in the proper spaced relationship such that the strip of insulation material can act as a carrier strip.

BACKGROUND OF THE INVENTION

It has been the practice in the prior art to stamp and form electrical contacts or terminals from a continuous strip of metal. The contacts at first were individually assembled to a printed circuit board and then soldered fixedly in place. The disadvantage of such a technique involved a requirement for hand labor to sort the contacts from one another, to assemble the contacts in desired alignment within the board, and to straighten the contacts in their final desired positions after soldering the contacts in place. Because hand labor is costly, there has been considerble effort directed toward reducing the amount of hand labor required for assembly of contacts to a printed circuit board. One of the first improvements to result from such effort resided in locating the terminals serially along a common carrier strip which was formed integral with the terminals during the stamping and forming process. This permitted the carrier strip to be fed into an insertion machine which individually severed a terminal from the strip and forcibly inserted it into a printed circuit board. The prior art further evolved into a technique whereby a plurality of electrical terminals along a common carrier strip were located within a comb-type tool which aligned the plurality of terminals for simultaneous insertion within corresponding locations in a circuit board. Using this technique, insertion of a larger number of terminals were simultaneously inserted, the common carrier strip served to align the terminals while the terminals were soldered fixedly in place within the printed circuit board. Subsequently, the carrier strip was removed from the terminals, leaving the terminals individually located within the printed circuit board.

Another version of the above techniques is described in U.S. Pat. No. 3,618,207 wherein a plurality of terminals, which extend transversely from a common carrier strip, have a body of insulating material molded transversely across the contacts. This molding is done using an intermittent molding process which provides individual housings. However, the disclosed insulative material is rigid and would prevent or hinder the further step of forming the terminals into particular configurations. Also, once the metal carrier strip is removed the individual molded housings will not be in strip form. This molding operation is relatively slow and costly.

U.S. Pat. No. 3,239,798 describes a multiple contact connector in which a plurality of spaced-apart, elongated, parallel contact strips are formed from a sheet of electrically conductive material, preferably by a known etching technique. The strip is placed between two sheets of insulation material and bonded thereto along only certain predetermined lengths of the contact strips. The ends of the strips are not bonded. The ends of the strips are formed into alternate arcuately extending resilient contacts and the laminar center portion is formed into a channel. The alteration of the arcuate ends causes the non-bonded insulation material to be separated from the formed contact ends to allow electrical contact with suitable circuitry. The steps of forming the connector according to this patent are quite complex.

U.S. Pat. No. 4,245,876 discloses a continuous strip of electrical terminals which is formed by stamping rectangular openings in a strip of metal. A strip of dielectric material is then adhered to the metal strips, after which the metal strips are formed into electrical terminals of a selected configuration. Discrete lengths of the formed terminals in strip form are held together as separate terminals via the dielectric material which can be severed from the continuous strip for specified uses. This arrangement has been found to be unsatisfactory for a number of reasons. One reason is the application of an adhesive to the metal strips must be followed by pressure and heat, requiring additional equipment and time, thereby increasing the cost of production. Another reason the above solution is unsatisfactory is that the adhesive does not completely encase the metal strips. Consequently, the terminals are not precisely maintained in position. This is an unacceptable result, as only the slightest movement of the terminals will result in problems in subsequent operations. A further problem with the adhesive is that it becomes brittle after time. This causes the adhesive to break, leaving the terminals with nothing to maintain them in position. When this occurs, the terminals must be handled as individual terminals with all of the problems and costs associated therewith.

SUMMARY OF THE INVENTION

An object of the present invention is to provide a method for producing a plurality of electrical terminals which can be produced in a continuous, uninterrupted strip form, which can be cut to any length desired. In so doing, it is essential that insulation material completely surround and entrap each of the electrical terminals, thereby ensuring that the plurality of terminals will be accurately maintained in position with respect to each other, as well as to the insulation material.

A further object of the present invention is to provide a strip of insulation material which will maintain the proper spacing of the terminals, as discussed, such that the insulation material will function as the carrier strip. This allows for quick, cost effective handling of the terminals through every step of the method of manufacture.

Another object of the present invention is to provide a method of manufacture which can be done at a constant high rate of speed, using a minimal amount of steps to produce the plurality of terminals.

The invention is directed to a method of producing a plurality of identical electrical terminals from a metal strip having the desired spring and conductive characteristics. At least one row of rectangular openings is stamped in the metal strip. The rectangular openings are positioned such that the longitudinal axis of the openings are essentially perpendicular to the longitudinal axis of the metal strip.

After the openings have been stamped, a web of insulation material is molded onto the strip of metal in alignment with each row of openings. The insulation material has the handling characteristics required to allow the insulation material to encompass metal sections of the metal strip which are positioned between the openings of a given row. The insulation material is applied to the metal strip in alignment with the openings, such that the insulation material covers the entire width of the openings except for the ends of the openings which are positioned essentially parallel to sides of the metal strips.

Once the insulation material is molded onto the metal strip, excess metal is removed in a high speed progressive die. Each piece of metal removed has a longitudinal axis in line with the longitudinal axis of a respective opening. After the metal is removed, a plurality of terminals remain. Metal is also removed from the ends of the terminals such that the carrier strip provided by the metal is removed. Consequently, the terminals are maintained in precise alignment relative to each other by the web of insulation material, i.e. the insulation material acts as the carrier strip.

BRIEF DESCRIPTION OF THE DRAWINGS

FIG. 1 is a perspective view of machinery utilized to make a continuous strip of electrical terminals.

FIG. 2 is a top plan view in broken form showing the various steps of making the continuous strip of electrical terminals.

FIG. 3 is a part perspective view showing one form of a continuous strip of electrical terminals.

FIG. 4 is similar to FIG. 3 showing the electrical terminals electrically connected to conductive paths of parallel disposed circuit boards.

FIGS. 5 through 11 are part perspective views showing various embodiments of the invention.

FIG. 12 is a part cross-sectional view of a further embodiment of the present invention.

DETAILED DESCRIPTION OF THE INVENTION

The present invention is directed to a method of manufacturing a strip of terminals which utilizes an insulation strip as the carrier strip. The method is effective for use with the terminals of many configurations, some of which are shown in FIGS. 5 through 11.

As shown in FIGS. 1 and 2, a continuous strip of metal 10 is fed into a conventional progressive die 12 which stamps metal strip 10 to form therein a series of aligned rectangular openings 14 and pilot holes 16. Rectangular openings 14, as best shown in FIG. 2, are positioned such that the longitudinal axis of openings 14 are essentially perpendicular to the longitudinal axis of metal strip 10. Metal strip 10 can be phosphor bronze or other nonferrous metal which has the desirable spring characteristics and current-carrying capacity.

The stamped metal strip is then fed into a conventional extrusion molding machine 18 in which continuous, uninterrupted webs of insulation material 20 are placed on the metal strips 10. As shown in FIG. 1, two webs of insulation material 20 are provided on the metal strip 10. Each web of insulation material 20 is a single, uninterrupted strip which extends from a first end of the metal strip 10 to a second end.

It is important to distinguish the present continuous, uninterrupted molding process from that of the type of intermittent, noncontinuous process described in the prior art. As an example, U.S. Pat. No. 3,618,207 discloses a molding process which molds individual separate housings over a given amount of terminals. Once the metal carrier strip is removed all that remains are individual housings with terminals positioned therein. The present invention is different in two main respects. First, the insulation housing is continuous, i.e. it extends from the first end of the metal strip of terminals 28 to the second end, thereby allowing the strip to be cut to any length. And second, as the insulation is continuous, it can be used as a carrier strip. Both of these will be discussed in more detail below.

The insulation material is positioned such that web of insulation material 20 covers rectangular opening 14 with the exceptions of the ends thereof, as best shown in FIG. 2. The insulation material 20 provided in openings 14 is dimensioned such that the thickness of material 20 corresponds to the thickness of metal strip 10. As an example, the thickness of insulation material 20 can be held as close as 0.010 of an inch. Insulation material 20 is any suitable plastic material that is substantially rigid but has some flexibility and has the necessary adhering characteristics to readily adhere to the metal strip so as to completely surround and encompass the metal sections between rectangular openings 14. Consequently, the insulation material has the characteristic to "flow" around each terminal, preventing the terminals from moving relative to each other. Completely surrounding and encompassing the metal sections with the molded insulation strip 20 provides the means to maintain the strips of metal in the proper position.

The stamped metal strip with the continuous web of insulation material 20 thereon is fed through a conventional progressive die 22 to stamp out the metal in alignment with aligned rectangular openings 14. Because the insulation material 20 is applied to the metal strip 10 in such a thin layer, as was previously decribed, the stamping operation can be performed using a flat die surface. The use of a flat die surface greatly increases the die speed and reduces the cost of tooling. As shown in FIG. 2, the metal that is removed is aligned with openings 14 such that the longitudinal axis of each opening is aligned with the longitudinal axis of the corresponding metal removed. Leaving the ends of openings 14 free of insulation material 20, as was discussed, allows the metal to be removed without damage to the web of insulating material 20. This removal of metal in alignment with openings 14, converts metal strip 10 from a continuous strip of metal into a continuous strip of insulated electrical terminals 28. Consequently, terminals 28 are maintained in spaced relationship by web of insulation material 20 which completely surrounds and encompasses each terminal. The edges of the stamped metal strip containing pilot holes 16 are also removed in progressive die 22, thereby eliminating the carrier strip which was used to feed the metal strip 10 through the stations. However, as a carrier strip is needed to form the strip of terminals 28 into the desired shape, the continuous web of insulation material 20 is used as the feeder strip. This highlights the importance of having the terminals maintained in spaced relationship with relation to the web of insulation material 20. As the terminals are presented to the subsequent stations they must be accurately positioned with respect to the carrier strip in order for each station to operate properly. There can be no movement of the terminals relative to the web of insulation material 20. Consequently, it is imperative that the insulation material 20 securely and accurately maintain terminals 28 in proper spaced relationship.

The continuous strip of terminals 28 can now be subjected to a forming operation in a conventional forming die wherein forming dies form the flat strip terminals into a desirable configuration, examples of which are shown in FIGS. 3 through 12.

It should be noted the operations of dies 22 and 26 can be performed using a single die tooling. However, for ease of explanation this process has been divided into two operations.

After terminals 28 are formed, the continuous strip can be cut to accommodate any size of connector required. For example, if only two terminals are required, two terminals will be severed from the strip. In the alternative, the continuous plurality of terminals 28 can be stored in some fashion until needed. If storage is to occur, it is critical that the insulation material accurately maintain the positioning of the terminals over time. Consequently, the ability of the molded insulation strip to completely surround and adhere to each terminal is critical to the effective usefulness of the terminals. For storage reasons, it is important that the insulation material have some flexibility, to facilitate wrapping the strip around a reel or the like.

The advantage obtained by utilizing the method described are significant. As an example, when compared to the method described in U.S. Pat. No. 4,245,876, the increase in speed and cost savings is significant. Due to the process used in that patent the operating speed will be between 7.5 and 8 feet per minute. The present method allows for operating speeds of between 30 to 40 feet per second, when a Valox 310 SEO insulation material is used. This represent a 4 to 5 fold increase in operating speed.

Some examples of the various configurations of the finished terminals are shown in FIGS. 5 through 11. While these embodiments will be described below, it is important to note that they are not exclusive, other configurations are possible.

The continuous strip of terminals 28 as shown in FIGS. 3 and 4 comprises a series of electrical terminals 30 each having terminal sections 32 connected together by a connecting section 34. Connecting sections 34 are disposed in a V-shaped configuration and connected together via continuous webs of insulation material terminals 28. Each of terminal sections 32 is in the form of a U-shaped clip member with the outer leg being bent inwardly towards the inner leg and the other leg ends in an outwardly-directed free end 36 which includes an inwardly-directed projection 38 that is disposed slightly outwardly from inwardly-directed projection 40 on the inner leg.

The continuous strip of electrical terminals 28 is shown in electrical engagement with conductive paths 42 of parallel disposed printed circuit boards 44 as an edge connector. The edge of boards 44 can bottom against the bottoms of terminal sections 32 while inwardly-directed projections 38 electrically connect with respective conductive paths 42 to interconnect the circuits in boards 44. The spring characteristics of terminal sections 32 provide excellent electrical and mechanical connections with conductive paths 42 as they wipingly connect with conductive paths 42.

The continuous strip of electrical terminals 28A of FIG. 5 are of the same configuration as that of continuous strip of electrical terminals 28 as shown in FIGS. 3 and 4 except that terminal sections 46 are in the form of electrical posts which are disposed in respective holes 48 in printed circuit board 50 so as to be flow-soldered to respective conductive paths thereon thereby electrically connecting the conductive paths on printed circuit board 44 with the respective conductive paths on printed circuit board 50. Sockets can be disposed in holes 48 and soldered to the conductive paths and terminal sections 46 can be electrically connected to such sockets. As can be discerned from FIG. 5, terminal sections 32 operate as an edge connector whereas terminal sections 46 can be mounted on printed circuit board 50 at any position therealong.

The continuous strip of electrical terminals 28B of FIG. 6 is the same as that of FIG. 5 except that terminal sections 52 include insulation-piercing terminal sections 54 that have insulation-piercing tines that pierce through the insulation covering a flexible cable 55 and are bent back into electrical engagement with the conductors contained therein to make electrical connection therewith. Also, a single web of insulation material 20 is utilized to maintain the electrical terminals 30B in spaced and isolated relationship with respect to each other.

FIG. 7 shows continuous strip of electrical terminals 28C in a form whereby terminal sections 32C are bent into a configuration so as to be surface mounted in accordance with conventional surface mounting practices to conductive paths 56 on abutting printed circuit boards 58. A similar arrangement is shown in FIG. 8 whereby terminal sections 32D of the continuous strip of electrical terminals 28D extend through holes 60 in printed circuit board 62 disposed in abutting relationship so as to be flow-soldered to the conductive paths thereon. Sockets can also be disposed in holes 60 and soldered to the conductive paths and in which terminal sections 32D can be electrically connected.

Terminal sections 32E of the continuous strip of electrical terminals 28E in FIG. 9 extend through holes 64 in parallel disposed printed circuit board 66 and are flow-soldered to respective conductive paths thereon. The terminal sections of the continuous strips of electrical terminals 28F and 28G as shown in FIG. 10 are soldered to respective conductive paths on vertically disposed printed circuit board 68; the terminal sections of the electrical terminals of strip 28G can be staggered with respect to those of strip 28F for space considerations. Sockets can be disposed in the holes in boards 66 and 68 of FIGS. 9 and 10, soldered to the conductive paths thereon and electrically connected to the terminal sections of the electrical terminal strips 28E, 28F and 28G. The electrical terminals of electrical terminals strips 28C, 28D, 28E, 28F and 28G need not be made from a spring metal.

The continuous strip of insulation material 20H in FIG. 11 has an L-shape in cross section, and terminal sections 32H are of leaf spring configuration and overlie the long leg of insulation strip 20H so that terminal sections 32H make electrical connection with respective conductive paths 70 of a liquid crystal display device 72 which is disposed between terminal sections 32H and the long leg of insulation strip 20H. The other terminal sections of the electrical terminals 30H are in form of posts which are flow-soldered to respective conductive paths of printed circuit board 74 through holes therein or electrically connected to sockets in the holes and soldered to the conductive paths. A similar arrangement is shown in FIG. 12 whereby the continuous strip of electrical terminals 28J have spring clip terminal sections 32J electrically connected to conductive paths of a liquid crystal display panel 76 that is mounted on a dielectric mounting member 78 via rubber pads 80 and mounting bolts 82 for shock absorption purposes. Posts 84 of the electrical terminals of continuous strip 28J extend through holes in mounting member 78 and are flow-soldered to respective conductive paths on printed circuit board 86. Posts 84 include V-shaped sections 88 which dampen any vibrations to prevent any damage to the glass to which the terminal sections 32J are electrically connected.

While a number of different forms of the continuous strip of electrical terminals have been disclosed, other forms of the continuous strip of electrical terminals can be realized to be utilized in conjunction with specific termination needs to electrically terminate electrical conductors. No separate molded housings are required to accommodate the strips of electrical terminals thereby eliminating costly assembly operations of assembling electrical terminals into housings. The manufacture of the continuous strips of electrical terminals of the present invention can be automated at very high speed.

What I claim is:

1. A method of producing a plurality of identical electrical terminals from a metal strip having the desired spring and conductive characteristics, the method comprising the steps of:
    stamping at least one row of rectangular openings in the metal strip, the rectangular openings positioned such that the longitudinal axis of the openings are essentially perpendicular to the longitudinal axis of the metal strip;
    molding a web of insulation material onto the strip of metal in alignment with each row of openings, the insulation material having the adhering characteristics required to allow the insulation material to encompass metal sections which are positioned between the openings of a given row, the insulation material being applied in alignment with the openings such that the insulation material covers the entire width of the openings except for the ends of the openings which are positioned essentially parallel to sides of the metal strips;
    stamping and removing pieces of metal from the metal strip, each piece of metal removed having a longitudinal axis in line with the longitudinal axis of a respective opening, such that a plurality of terminals remain, metal also being removed from the ends of the terminals such that the carrier strip provided by the metal is removed, the terminals being maintained in precise alignment relative to each other by the web of insulation material, the insulation material acting as the carrier strip.

2. A method as set forth in claim 1 comprising the further step of forming each identical electrical terminal into a configuration including terminal sections connected together by connecting section, each of the terminal sections having an identical configuration.

3. A method as set forth in claim 2 comprising the further step of cutting the plurality of terminals to any desirable length.

4. A method as set forth in claim 1 wherein two rows of openings are stamped from the metal strip.

5. A method as set forth in claim 4 wherein the step of molding includes molding two continuous webs of insulation material onto the metal strip.

6. A method as set forth in claim 1 wherein the step of molding provides insulation material which is dimensioned such that the insulation material corresponds to the thickness of the metal strip.

7. A method of manufacturing a plurality of contact terminals in a continuous, uninterrupted strip form, the method comprising the steps of:
    stamping a plurality of openings in a strip of metal having the desired spring characteristics, the plurality of openings being aligned in at least one row, such that the longitudinal axis of each individual opening is essentially perpendicular to the longitudinal axis of the metal strip;
    molding with an extrusion apparatus a thin web of insulation material across each opening and in alignment with each row of openings, the insulation material covering the entire width of each opening except for the ends thereof, the insulation material being molded onto the metal strip is such a manner as to produce at least one continuous, uninterrupted web of insulation material;
    removing metal which is in alignment with the rectangular openings, the metal removed having a longitudinal axis which is essentially perpendicular to the longitudinal axis of the metal strip such that a plurality of individual terminals are provided;
    removing metal carrier strips from the ends of the individual terminals, the terminals being maintained in precise alignment relative to each other by the web of insulation material, the insulation material acting as the carrier strip.

8. A method as set forth in claim 7 comprising the further step of forming each identical electrical terminal into a configuration including terminal sections connected together by connecting section, each of the terminal sections having an identical configuration.

9. A method as set forth in claim 8 comprising the further step of cutting the plurality of terminals to any desirable length.

10. A method as set forth in claim 7 wherein two rows of openings are stamped from the metal strip.

11. A method as set forth in claim 10 wherein the step of molding includes molding two continuous webs of insulation material onto the metal strip.

12. A method as set forth in claim 7 wherein the step of molding provides insulation material which is dimensioned such that the insulation material corresponds to the thickness of the metal strip.

13. A method of manufacturing a plurality of contact terminals in a continuous uninterrupted strip form, the method comprising the steps of:
    stamping a plurality of openings in a strip of metal having the desired spring characteristics, the plurality of openings being aligned in at least one row;
    molding with an extrusion molding apparatus a thin web of insulation material across the strip of metal in alignment with each row of openings, the insulation material cooperating with the openings, such that the terminals are partially embedded in the insulation material, the insulation material being molded onto the metal strip is such a manner as to produce at a continuous, uninterrupted web of insulation material;

removing metal which is in alignment with the rectangular openings such that a plurality of individual terminals are provided;

removing a metal carrier strip from the ends of the individual terminals, the terminals being maintained in precise alignment relative to each other by the web of insulation material which embeds the terminals, the insulation material acting as the carrier strip.

14. A method as set forth in claim 13 comprising the further step of forming each identical electrical terminal into a configuration including terminal sections connected together by connecting sections, each of the terminal sections having an identical configuration.

15. A method as set forth in claim 13 comprising the further step of cutting the plurality of terminals to any desirable length.

16. A method as set forth in claim 13 wherein the step of molding provides insulation material which is dimensioned such that the insulation material corresponds to the thickness of the metal strip.

* * * * *